United States Patent [19]

Lettington et al.

[11] Patent Number: 5,723,207
[45] Date of Patent: Mar. 3, 1998

[54] INFRA-RED TRANSPARANT MATERIALS

[75] Inventors: Alan H Lettington, Battenhall; Colin Smith, Malvern, both of England

[73] Assignee: The National Research Development Corporation, London, England

[21] Appl. No.: 543,804
[22] PCT Filed: Jan. 19, 1989
[86] PCT No.: PCT/GB89/00068
§ 371 Date: Jul. 23, 1990
§ 102(e) Date: Jul. 23, 1990
[87] PCT Pub. No.: WO89/06707
PCT Pub. Date: Jul. 27, 1989

[30] Foreign Application Priority Data

Jan. 21, 1988 [GB] United Kingdom ............ 8801366

[51] Int. Cl.$^6$ .................. B32B 9/00; B32B 7/02
[52] U.S. Cl. .............. 428/216; 204/192.12; 427/160; 427/162; 427/164; 427/165; 428/212; 428/336; 428/469; 428/432; 428/433; 428/446; 428/697; 428/698
[58] Field of Search ............... 428/698, 697, 428/699, 432, 433, 457, 469, 472, 336, 212, 446, 216, 913; 204/192.12; 427/34, 39, 160, 162, 164, 165

[56] References Cited

U.S. PATENT DOCUMENTS

| | | | |
|---|---|---|---|
| 3,885,855 | 5/1975 | Gross | 350/166 |
| 4,098,956 | 7/1978 | Blickensderfer et al. | 428/469 |
| 4,268,569 | 5/1981 | Hale | 428/457 |
| 4,401,719 | 8/1983 | Kobayashi et al. | 428/457 |
| 4,535,000 | 8/1985 | Gordon | 427/255.2 |
| 4,560,576 | 12/1985 | Lewis et al. | 427/38 |
| 4,591,418 | 5/1986 | Snyder | 428/697 |
| 4,599,281 | 7/1986 | Schintlmeister et al. | 428/699 |
| 4,699,850 | 10/1987 | Kishi et al. | 428/469 |
| 4,704,339 | 11/1987 | Green et al. | 428/689 |
| 4,710,426 | 12/1987 | Stephens | 428/336 |
| 4,740,447 | 4/1988 | Itoh | 430/270 |
| 4,763,139 | 8/1988 | Itoh | 430/495 |
| 4,774,151 | 9/1988 | Cuomo et al. | 428/698 |
| 4,776,863 | 10/1988 | Van der Berg et al. | 428/698 |
| 4,791,017 | 12/1988 | Hofmann et al. | 428/469 |
| 4,839,208 | 6/1989 | Nakagawa et al. | 428/699 |
| 4,839,245 | 6/1989 | Sue et al. | 428/698 |

FOREIGN PATENT DOCUMENTS

| | | |
|---|---|---|
| 60-1810 | 7/1985 | Japan . |
| 63-242948 | 10/1988 | Japan . |
| 1408294 | 10/1975 | United Kingdom . |
| 2082562 | 3/1982 | United Kingdom . |
| 2110246 | 6/1983 | United Kingdom . |
| 2129833 | 5/1984 | United Kingdom . |
| 2165266 | 4/1986 | United Kingdom . |

OTHER PUBLICATIONS

Solar Energy, vol. 19, pp. 429-432, Pergamon Press 1977, "Technical Note" Spectral Reflectance of $TiN_x$, and $ZrN_x$ films as selective solar (cont) absorbers, R. Blickensderfer et al.

Solar Energy, vol. 19, 1977, R. Blickensderfer et al, pp. 429–432 "Spectral Reflectance of $TiN_x$ & $ZrN_x$ films as Selective Solar Absorbers".

Solar Energy, vol. 14, No. 3–5, 1986, pp. 375–384, A.M. Bonnot et al "Reactively Sputtered Zirconium Carbides, Carbonitides & Nitrides Thin Films–Optical Properties".

*Primary Examiner*—Archene Turner
*Attorney, Agent, or Firm*—Nixon & Vanderhye P.C.

[57] ABSTRACT

Material transparent at infra red wavelengths, 3–5 and 8–14 µm is formed of ZrN, YN, CeN, TLN, or EuN. The material can be used as a self supporting material or as a coating on substrates such as infra red transparent material e.g. Ge, ZnS, ZnSe, $As_2S_3$, $As_2Se_3$, optically transparent materials e.g. sodium glass, or reflecting surfaces such as metal surfaces, e.g. Al or silvered surfaces. For some substrates e.g. Ge a thin, e.g. 10–1,000 Angstrom bonding layer may be used to improve adhesion. Bonding layers may be Ge, Si, $Ge_xC_{1-x}$, $Si_xC_{1-x}$ (0<x<1). The coating may be produced by sputtering in a glow discharge chamber using Ar and N gases.

20 Claims, 6 Drawing Sheets

INFRA-RED TRANSPARANT MATERIALS

BACKGROUND OF THE INVENTION

1. Field of the Invention

This invention relates to infra red transparent materials. Such materials are useful as windows and lenses for thermal imaging systems, either as a coating or as a self supporting layer.

2. Discussion of Prior Art

Materials commonly used are germanium, zinc sulphide, and zinc selenide. All are relatively soft and therefore easily damaged. One method of protecting these soft materials is to coat them with a hard material. The coating most successful to date is a hard carbon that is diamond like in its hardness. This is described in GB 2,082,562 B. Disadvantages of this material are the interstitial graphitic inclusions which limit the optical transmission and the internal strain which prevents layers thicker than about 1 um being grown. An alternative coating of hard carbon includes a small amount of germanium to relieve stress and allow thicker coatings to be made; this is described in GB 2,129,833 A and its divisional 85 24,696.

Ideally a hard coating should be transparent in the 3–5 and 8–14 μm infra red wavebands, and also in the visible band i.e. about 0.4 to 0.7 μm. It is further desirable that the coating is stable and transparent at high temperatures so that it may be used as a window for high temperature processes. A disadvantage of the hard carbon, and hard germanium carbon coatings is their high temperature performance. On heating to say 600° C. the carbon changes to a graphitic form which is absorbing to infra red radiation. These materials are also absorbing to visible light in useful thicknesses.

SUMMARY OF THE INVENTION

It is an object of this invention to provide a material that is infra red transparent over a wide band of wavelengths and elevated temperatures.

According to this invention an infra red transparent material is formed of Zirconium nitride or Yttrium nitride also Cerium or Thorium or Europium nitride.

The material my be used as a coating on infra red transparent substrate material such as Ge, ZnS, ZnSe, $AsS_3$, $AsSe_3$; optically transparent material such as sodium, silica or lead glass; any suitable metal such as Cu, Al, alloys of Al, alloys of Fe or silvered surfaces; or as a self supporting layer in which case the supporting substrate is removed e.g. by etching. These infra red transparent materials Ge, etc., are transparent in the 1.9–2.7, 3–5 and 8–14 μm wavebands. ZnS, ZnSe, $As_2S_3$, $As_2Se_3$ are also partly transmissive in the visible waveband. Glass is transparent up to about 2 5 μm i.e. the visible and near infra red waveband. The coating is hard and may therefore be used for its abrasion resistant properties for example on infra red windows and lenses. Alternatively it may be used on metal to maintain a highly polished surface on components such as turbine blades and ductings. A further use on metals is to provide a hard wear resistant coating on cutting tools used on lathes etc.

The material may be formed by reactive sputtering using a target of Zr Y, Ce, Eu or Th in a DC or RF glow discharge of the gases Ar and N.

According to this invention an optical component comprises a transparent substrate coated with a transparent thin layer of ZrN, YN, CeN, EuN or ThN, the component being transparent in either or both the infra red (1.9–2.7, 3–5 and 8–14 μm) and visible band (0.4 to 0.7 μm) of wavelengths.

According to an aspect of this invention a machine tool cutting tip, turbine or pump blade is coated with an abrasion resistant coating of ZrN, YN, CeN, ThN or EuN.

According to another aspect of this invention the reflecting surfaces of a direct view thermal imager are coated with a thin layer of ZrN, YN, CeN, Thn or EuN.

According to this invention a method of producing Zirconium, Yttrium, Cerium, Thorium or Europium nitride comprises the steps:

providing an anode and a cathode inside a vacuum chamber, arranging a target of Zr, Y, Ce, Th or Eu on the cathode, mounting a substrate to be coated opposite and spaced from the cathode, maintaining the substrate at a desired temperature of between 300° and 600° C., flowing gases of argon and nitrogen through the chamber whilst maintaining a reduced pressure inside the chamber, providing a glow discharge plasma inside the chamber between the anode and cathode whereby argon ions sputter off material from the target to combine with nitrogen on the substrate and form the desired coating.

The glow discharge may be provided by an R.F. or a D.C. electric field. Enhanced deposition rate may be provided by magnetron sputtering.

The substrate to be coated may be mounted directly on the anode or spaced therefrom.

Alternatively the coatings may be grown by molecular beam epitaxy (MBE) growth apparatus, vapour phase epitaxial growth apparatus, or by a ceramic process. In this latter case a powder of Zr, Ce, Th, or Eu nitride is formed and milled to the required particle size, then pressed into a blank of the required shape and fired at an elevated temperature until a ceramic blank is formed.

Care must be taken in forming the coating otherwise a dark absorbing layer is grown.

BRIEF DISCUSSION OF THE DRAWINGS

The invention will now be described, by way of example only, with reference to the accompanying drawings of which:

Figure 2:
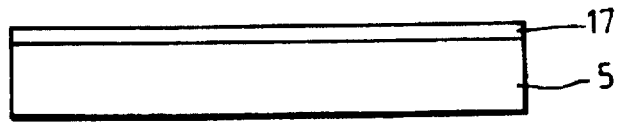
FIG. 2 is a sectional view of a component coated in the apparatus of FIG. 1.
Figure 3A:
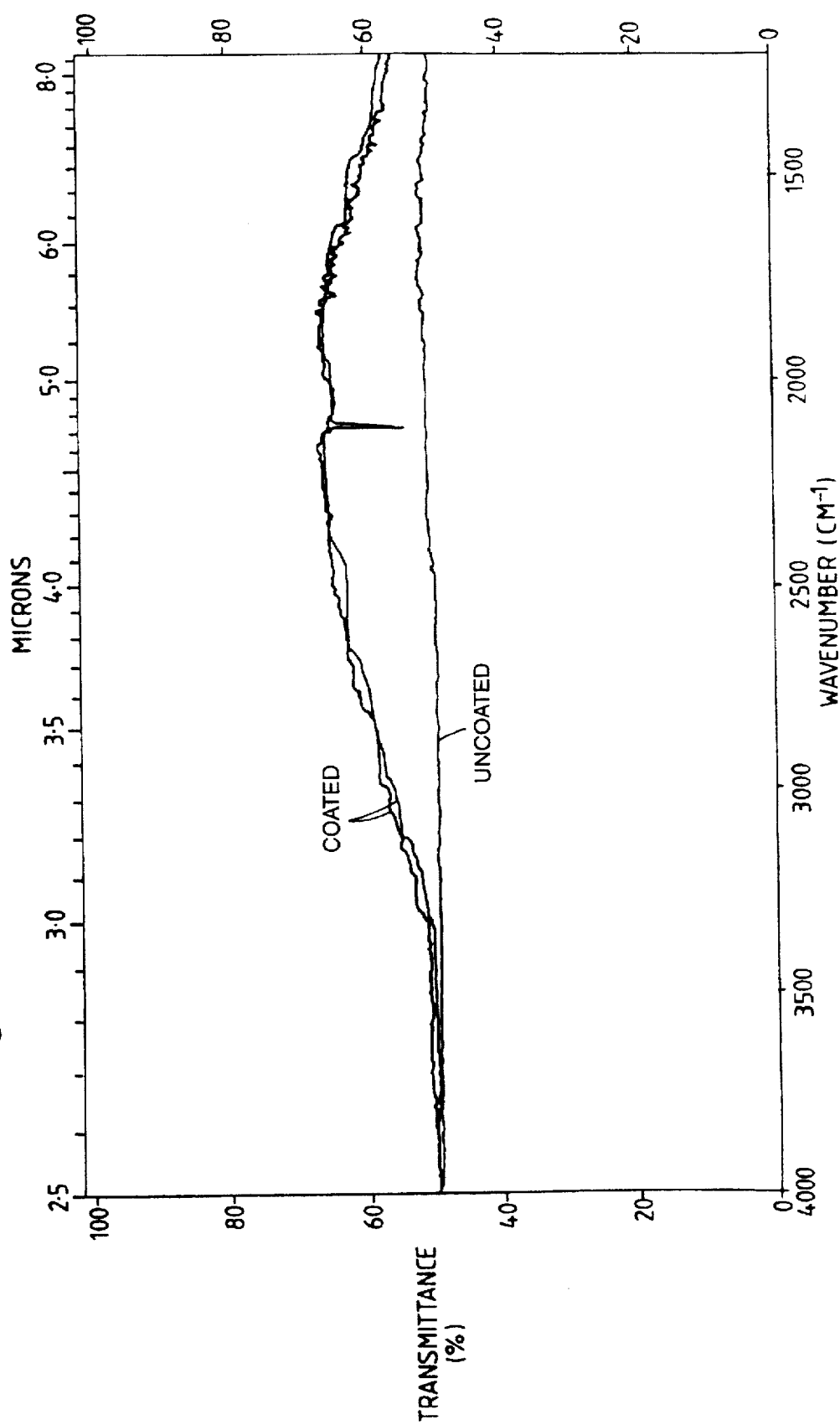

FIGS. 3(a), (b), 4(a), (b) are graphs of transmission against wavelength for the component of FIG. 2.

Figure 5:
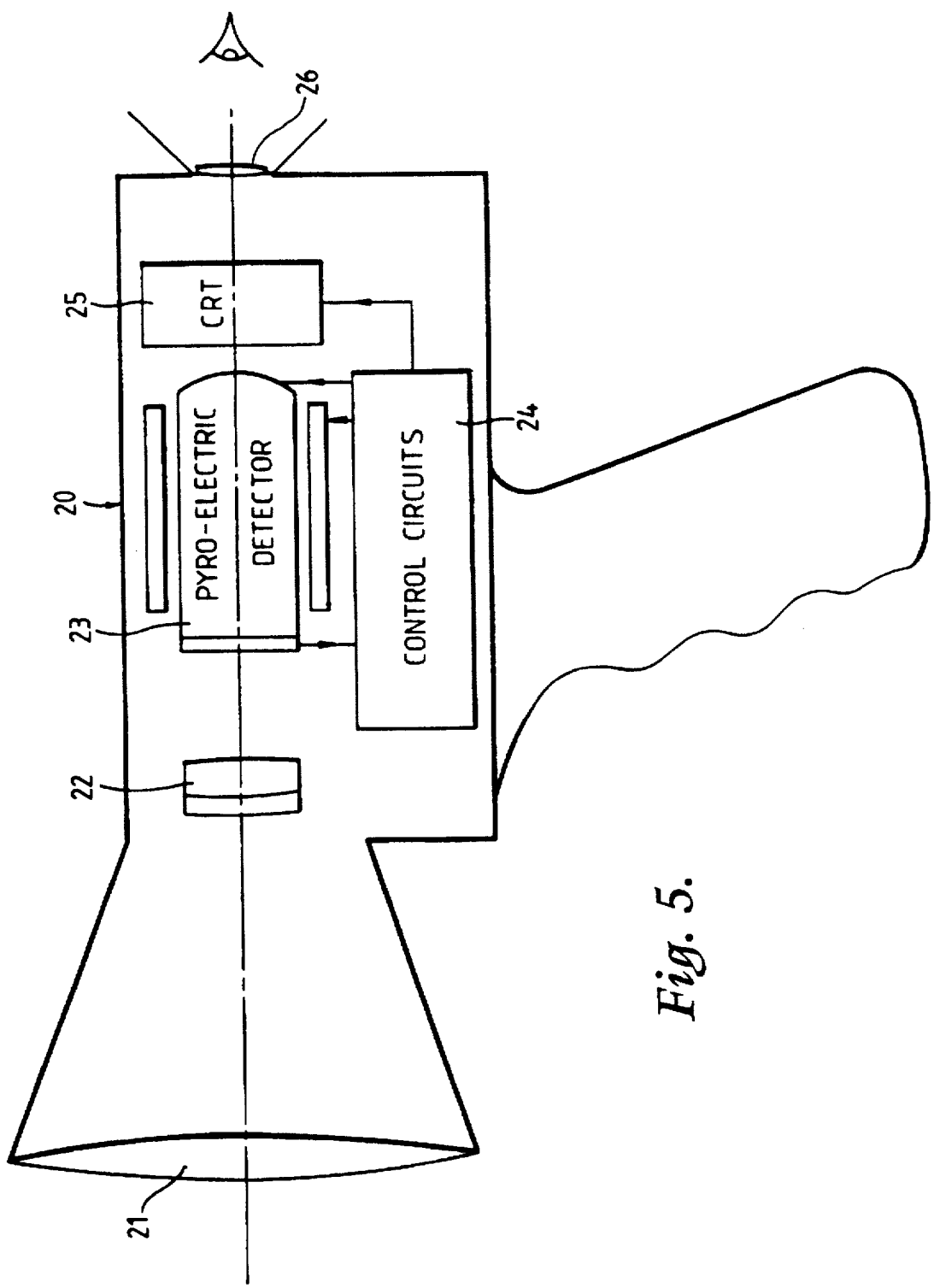

FIG. 5 is a diagrammatic view of a pyro-electric vidicon camera.

DETAILED DISCUSSION OF PREFERRED EMBODIMENTS

Figure 1:
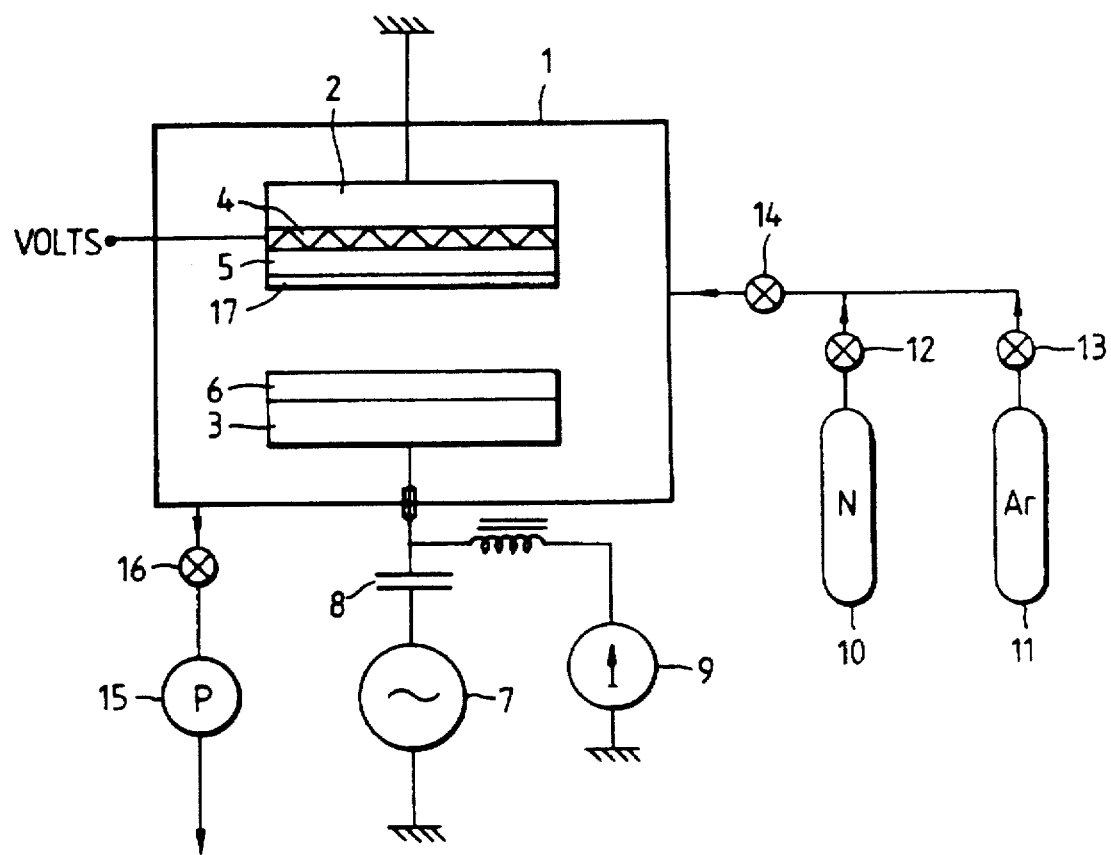
FIG. 1 is a cross sectional view of glow discharge apparatus.

As shown in FIG. 1 glow discharge apparatus comprises a vacuum tight chamber 1 containing an anode plate 2 and a cathode plate 3. The anode 2 is heated by a heater 4 and carries a substrate 5 to be coated. Examples of substrate materials are Ge, ZnS, Zn Se, and metals such as Cu, Al, silvered surfaces, and various alloys and steels. Both the chamber 1 and anode 2 are connected to earth. The cathode 3 carries a plate of target material 6, e.g. Zirconium (Zr) or Yttrium (Y), and is connected to an RF source 7 via a capacitor 8. Negative voltage developed at the cathode is measured by a D.C. voltmeter 9. Gas bottles 10, 11 supply nitrogen and argon through valves 12, 13, 14 into the chamber 1. A vacuum pump 15 removes gases from inside the chamber 1 via a restrictor valve 16.

Operation to grow a Zr, or Y nitride layer 17 transparent to a wide band of wavelengths, including the infra red and visible, is as follows: The target 6 and substrate 5 are mounted as shown on the cathode 3 and anode 2 respectively. The anode 2 and substrate 5 temperatures are raised to about 500° to 550° C. Other temperatures may be used. However, below about 500° C. the grown layer becomes increasingly absorbing. Above about 600° C. there are practical difficulties in providing an anode/substrate holder and reliable resistance heaters. The pump 15 is operated to drop the pressure to about 30 millitorr whilst nitrogen and argon gasses are admitted from the bottles 10, 11 and an RF D.C. bias of about −1 kvolts is applied to the cathode. This produces a plasma discharge between the anode 2 and cathode 3. Argon ions strike the target and remove atoms of the target material which combine with nitrogen in the plasma to deposit as a layer 17 of zirconium nitride or yttrium nitride on the substrate 5. For correct deposition parameters the layer is transparent to a wide band of wavelengths e.g. 0.4–16 µm.

Ce, Th or Eu nitride coating layers are grown in a similar manner.

When growing Zr nitride the percentage of N to Ar is about 50%. For Y nitride the percentage of N to Ar is about 1%. Deposition rates are typically 0.2 µm/hour for ZrN and 0.4 µm/hour for YN. These rates nay be increased by magnetron sputtering techniques.

Prior to coating the substrates may be cleaned for example by Ar ion bombardment. This my be achieved by mounting the substrate on the cathode 3, admitting Ar into the chamber whilst reducing the pressure to about 20 millitorr. A glow discharge is initiated and maintained for about 5 minutes. A similar cleaning process may be made to the target 6.

Coatings of ZrN and YN have excellent adhesion to most metals, e.g. Al, Duraluminium, Cu, stainless steel and Ag. The adhesion on Ge, ZnSe, and ZnS is good but less than for the metals. To improve adhesion on Ge, ZnSe, and ZnS, a very thin bonding layer (less than 0.5 um) of $Ge_xC_{1-x}$ (0<x<1) may be deposited from a vapour of Ge and C. Typically only a few Angstroms thick layer is needed. For example the bonding layer may be 10 to 1,000 typically 100 Angstroms thick. Being so thin the bonding layer has negligible effect on transmission at any wavelength. The Ge and C vapour may be produced in the apparatus of FIG. 1 using a glow discharge to dissociate germane and hydrocarbon gases, without sputtering from a Zr or Y target. Other bonding materials are Ge, Si, and $Si_xC_{1-x}$ produced as for GeC. Silicon alone, with carbon, or as an oxide may be used. This can be deposited using a silane feedstock.

Figure 3B:
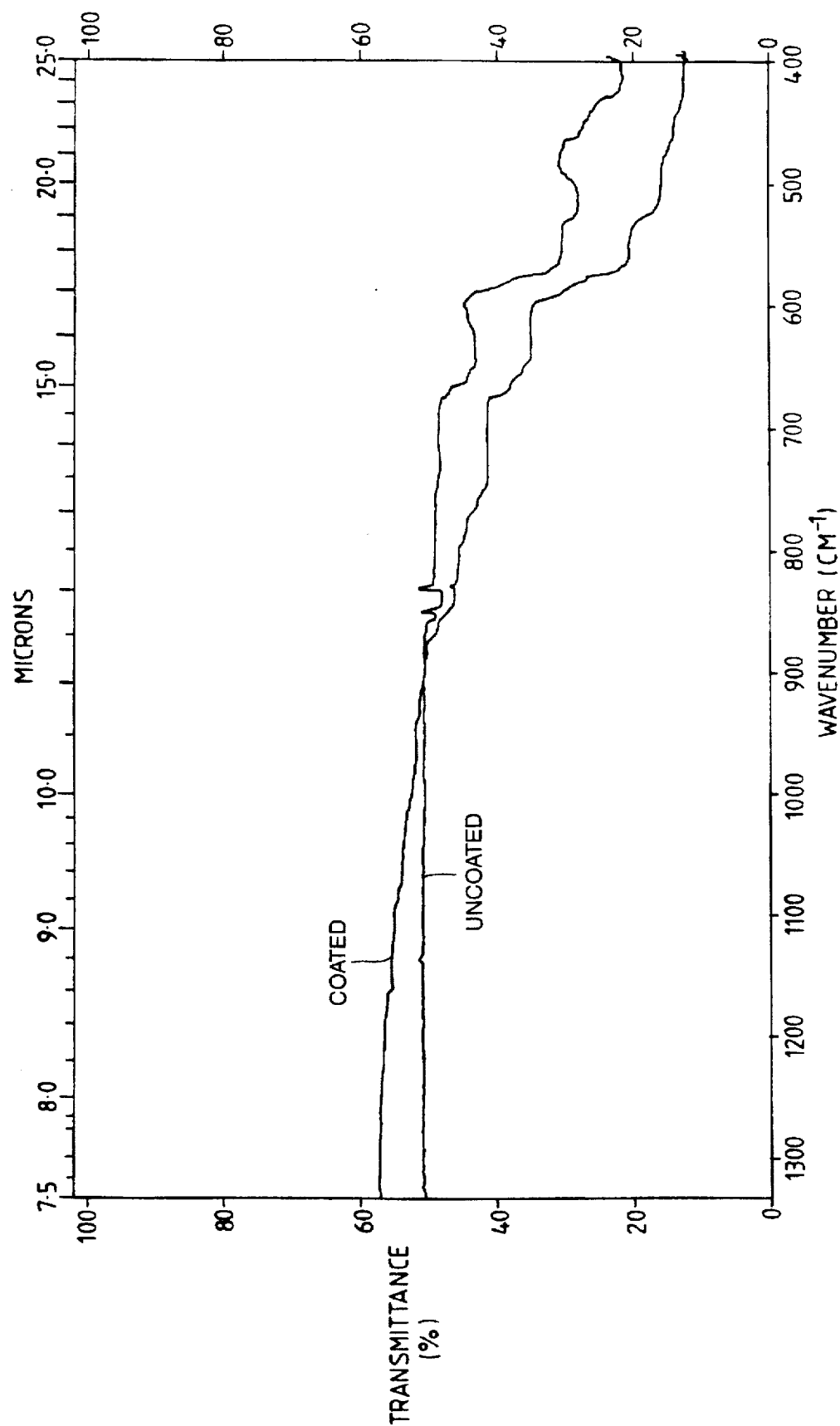
Figure 4A:
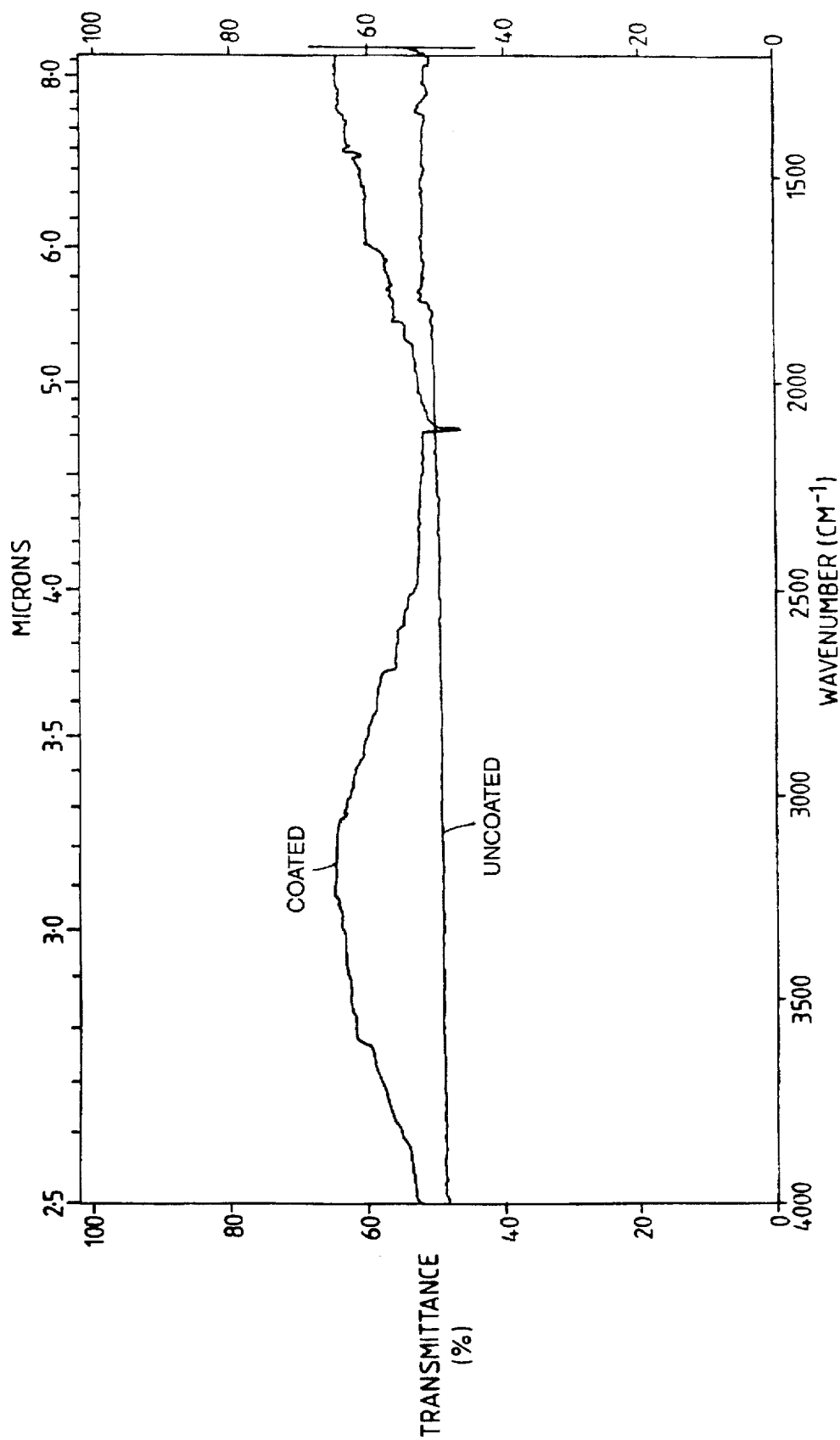
Figure 4B:
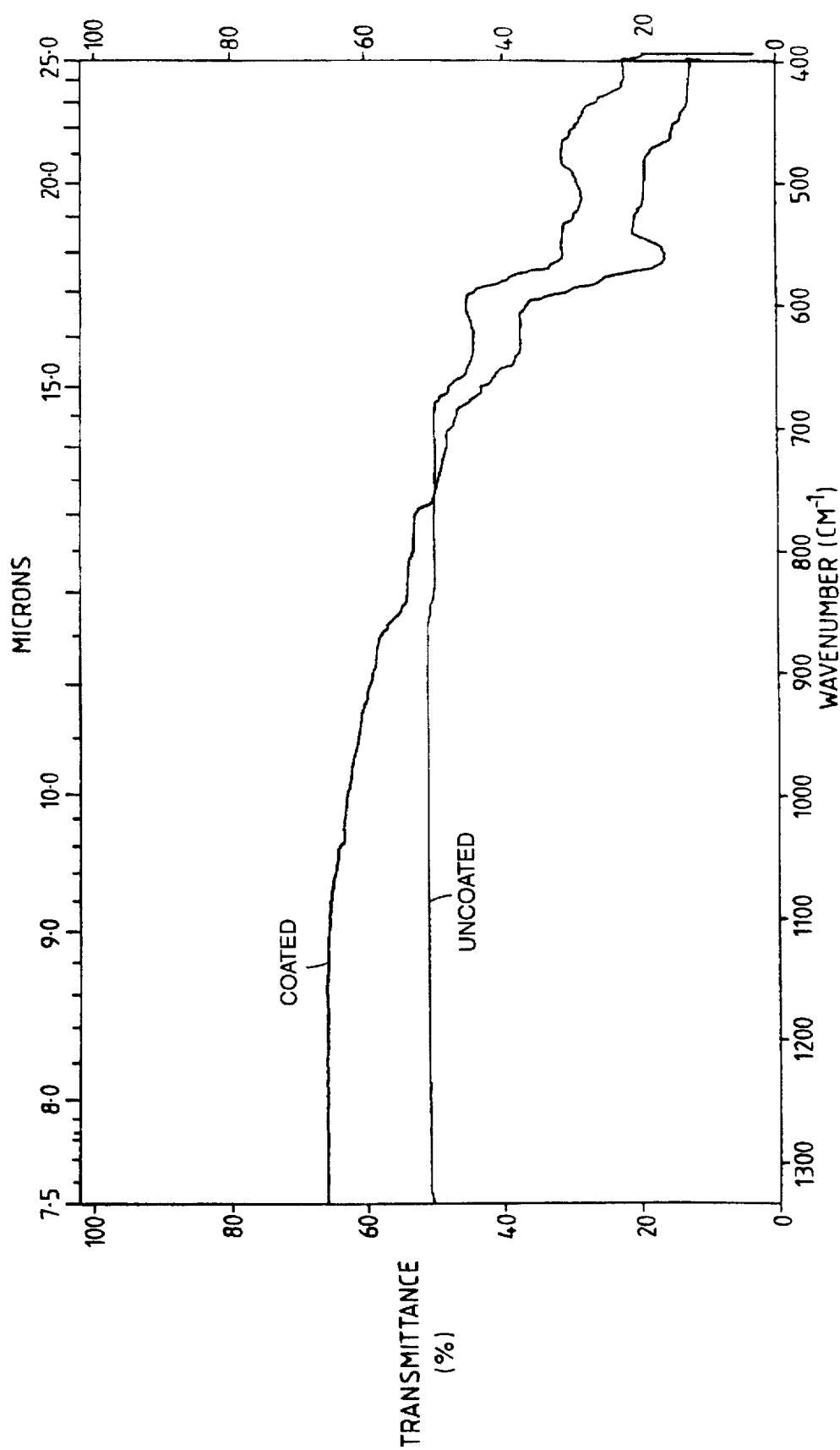

FIGS. 3(a), (b) show the transmittance values for a Ge substrate and for a Ge substrate coated with 0.5 um of ZrN, the coated substrate being the upper two traces (carried out with slightly different apparatus settings). FIGS. 4(a), (b) show transmittance values for Ge and Ge coated with a 1 um thick layer of YN. Both FIGS. 3 and 4 show excellent transmittance from 2.5 um out to 12 um and 14 um for ZrN and YN respectively.

Coating thickness for anti-reflection proporties can be calculated as follows:

$$2n_1d=\lambda/2$$

where $n_1$ is refractive index of coating d is coating thickness $\lambda$ is wavelength of radiation concerned.

For good matching $n_1=\sqrt{n_o \times n_2}$ where $n_o$ and $n_2$ are the refractive indexes of the material either side of the coatings. For air $n_o=1$, for bulk Ge $n_2=4$.

The refractive index was found to be 2.1 for both ZrN and YN which is ideal for use as an antireflection coating on Ge lenses. For use in 8–14 µm thermal imagers the antireflection coating would be 1.2 µm thick for a $\lambda/4$ thickness at 10 µm wavelength.

The coatings were found to be chemically inert and very hard, having a hardness value >2000 Knoop. This approaches that of diamond-like carbon coatings of the prior art. Unlike these diamond-like coating the ZrN and YN coatings are stable at temperatures in excess of 500° C. for long periods.

These properties make the coating useful as windows on tanks and other vehicles where the combination of windsreen wipers and sand make it essential that very hard coatings are used. Behind these windows thermal imagers are arranged to view the thermal scene. Prior to the introduction of hard carbon coatings the lifetime of such windows was very short. An advantage of coatings of the present invention over hard carbon coatings is their optical transparancy. This allows both thermal and optical imaging systems to be arranged behind the windows of optically and infrared transmitting material, e.g. ZnS, ZnSe $As_2S_3$, $As_2Se_3$ window.

The refractive index of ZrN, YN at about 2.1 is similar to that of ZnS,ZnSe, and sodium glasses. Thus coatings directly on such substrates are protective without being anti-reflective. To provide anti-reflective properties a multi coated layer must be used. For example on ZnS or ZnSe substrates a GeC $\lambda/4$ layer with an n≅3 may be used directly on the substrate. As taught in GB 2,129,833 the value of n is variable with the rati of Ge to C. Next a layer of GeC with a graded refractive index (effective n=4) is used by varying the Ge:C ratio. The final layer is of a $\lambda/4$ thickness (e.g. 1.2 µm at 10 µm wavelength) of ZnN, or YN.

Alternatively on ZnS, ZnSe substrates a thick coating, e.g. up to 20 um or more, may be used. This thick coating gives added mechanical protection. A final anti-reflection coating of ThF may be deposited. This is not very hard but for some applications gives an adequate protection.

Another use of the coatings of the present invention is as a front coating on Ge lenses. FIG. 5 shows a pyroelectric vidicon camera used by fire fighting services to see through smoke inside burning buildings. These known cameras 20 have a front Ge lens 21 plus other smaller lenses 22 focussing the thermal scene onto a pyroelectric detector tube 23. Output from the tube 23 is used by control circuits 24 to modulate a cathode ray tube (CRT) 25 and form a visible display 26 of the thermal scene. The front lens 21 is coated with ZrN or YN so that dirt is easily removed without damaging the soft Ge material.

Similarly the front lens of optical cameras used in surveying sewers etc may be coated with ZrN or YN to prevent damage.

The high temperature stability enables the material to be used on windows subject to adverse conditions such as in furnaces etc.

Another use of the invention is in direct view thermal imagers. These are known imagers, e.g. G.B. 2,291,196 A, having rotating polygons and/or flapping mirrors to sweep scan the image of a thermal scene onto an infra red detector. Output from the detector modulates the light output from a lamp such as a light emitting diode (LED). The rotating polygons and/or flapping mirror also scans the LED into an eye piece for observation by an operator. The scanning mechanism is thus used to scan infra red and visible light.

A problem with rotating polygons is tarnishing of the highly polished reflecting surfaces. One solution to this problem is disclosed in G.B. 2,067,304. A thin layer of infra red transparent amorphous carbon is deposited on the reflecting surfaces. Such a solution is only useful in standard imagers where the detector output modulates a C.R.T. display. The hard carbon is opaque to visible light. Therefore it cannot be used in direct view thermal imagers.

However this problem can be overcome by use of the present invention. Reflecting surfaces are protected by a thin coating of ZnN, YN, CeN, ThN or EuN, transparent at infra red and optical wavelengths. The coating may be less than 1 μm—typically about 0.1 to 0.2 μm thick.

Self supporting thick, e.g. 10 to 1000 μm or more, layers may be grown e.g. on Al substrates, and the substrate subsequently removed by an etchant such as nitic acid, or hydrochloric acid.

We claim:

1. A method of producing an infrared and visible light transparent coating comprising the steps of:

providing an anode and a cathode inside a vacuum chamber, arranged a target of at least one of Zr, Y, Ce, Th and Eu on the cathode, mounting a substrate to be coated opposite and spaced from the cathode, maintaining the substrate at a desired temperature of between 500° and 600° C., flowing gases of argon and nitrogen through the chamber whilst maintaining a reduced pressure inside the chamber, providing a glow discharge plasma inside the chamber between the anode and cathode whereby argon ions sputter off material from the target to combine with nitrogen on the substrate and form the desired coating transparent to visible and infra red wavelength of 3–5 and 8–14 um.

2. An improved infrared and optically transparent coating for a substrate, said coating transparent to visible and infrared radiation having a wavelength between 0.4 and 16 μm, said coating comprising a layer of a nitride of one of Zirconium, Yttrium, Cerium, Thorium and Europium, wherein said substrate is one of germanium, zinc sulphide, zinc selenide, arsenic sulphide, arsenic selenide, copper, aluminum, sodium glass, silver and steel.

3. The coating of claim 2, wherein said coating further includes a bonding layer between nitride layer and said substrate, said bonding layer comprising an infrared and visible light transparent layer less than 0.5 μm thick.

4. The coating according to claim 3, wherein said bonding layer is one of Ge, Si, $Ge_xC_{1-x}$, $Si_xC_{1-x}$ where $0<x<1$.

5. The coating according to claim 2, wherein said coating is an anti-reflective coating for a wavelength λ wherein said nitride layer has a refractive index $n_1$ and has a thickness d, where d equals $\lambda/4n_1$.

6. An infrared and visible light transparent window, said window including an infrared and visible light transparent substrate, said window provided by the steps of:

providing an anode and a cathode inside a vacuum chamber;

arranging a target of at least one of Zr, Y, Ce, Th and Eu on said cathode;

mounting said substrate opposite and spaced from said cathode;

maintaining said substrate at a desired temperature of between 500° C. and 600° C.;

flowing gases of argon and nitrogen through said vacuum chamber while maintaining a reduced pressure inside said chamber; and providing a glow discharge plasma inside said chamber between said anode and said cathode, whereby argon ions sputter off material from said target to combine with nitrogen on said substrate forming said desired window transparent to visible and infrared radiation.

7. The infrared and visible light transparent window according to claim 6 wherein prior to said second providing step, there is the additional step of growing a bonding layer of one of Ge, Si, $Ge_xC_{1-x}$ and $Si_xC_{1-x}$ of a thickness less than 0.5 μm where $0<x<1$.

8. The infrared and visible light transparent window of claim 6 wherein said substrate is sodium glass.

9. The infrared and visible light transparent window according to claim 6 wherein said window includes an anti-reflective coating for a wavelength λ, said coating having a refractive index $n_1$ and a thickness d, where d equals $\lambda/4n_1$.

10. An infrared and visible light transparent coating for a substrate, said coating provided by the steps of:

providing an anode and a cathode inside a vacuum chamber;

arranging a target of at least one of Zr, Y, Ce, Th and Eu on said cathode;

mounting said substrate to be coated opposite and spaced from said cathode;

maintaining said substrate at a desired temperature of between 500° C. and 600° C.;

flowing gases of argon and nitrogen through said vacuum chamber while maintaining a reduced pressure inside said chamber; and providing a glow discharge plasma inside said chamber between said anode and said cathode, whereby argon ions sputter off material from said target to combine with nitrogen on said substrate forming said desired coating transparent to visible and infrared radiation.

11. The infrared and visible light transparent coating according to claim 10, wherein said substrate is one of germanium, zinc sulphide, zinc selenide, arsenic sulphide, arsenic selenide, copper, aluminum, silver and steel.

12. The infrared and visible light transparent coating according to claim 10, wherein said substrate is a metallic reflecting substrate and said coating is a layer less than 1 μm.

13. A method of producing an infrared and visible light transparent coating on a non-metallic substrate comprising the steps of:

providing an anode and a cathode inside a vacuum chamber, arranging a target of at least one of Zr, Y, Ce, Th and Eu on the cathode, mounting said non-metallic substrate to be coated opposite and spaced from the cathode, maintaining the substrate at a desired temperature of between 500° to 600° C., flowing gases of argon and nitrogen through the chamber whilst maintaining a reduced pressure inside the chamber, providing a glow discharge plasma inside the chamber between the anode and cathode whereby argon ions sputter off material from the target to combine with nitrogen on the substrate and form the desired coating transparent to visible and infra red wavelength of 3–5 and 8–14 µm.

14. The method of claim 1 wherein, prior to growing the coating, providing the additional step of growing a bonding layer of one of Ge, Si, $Ge_xC_{1-x}$, and $Si_xC_{1-x}$ of thickness less than 0.5 µm, where $0<x<1$.

15. The method of claim 13, wherein, prior to growing the coating, providing the additional step of growing a bonding layer of one of Ge, Si, $Ge_xC_{1-x}$, and $Si_xC_{1-x}$ of thickness less than 0.5 µm, where $0<x<1$.

16. An improved infrared and optically transparent coating for a non-metallic substrate, said coating transparent to visible and infrared radiation having a wavelength between 0.4 and 16 µm, said coating comprising a layer of a nitride of one of Zirconium, Yttrium, Cerium, Thorium and Europium, wherein said substrate is one of germanium, zinc sulphide, zinc selenide, arsenic sulphide, arsenic selenide, and sodium glass.

17. The coating of claim 16, wherein said coating further includes a bonding layer between said nitride layer and said substrate, said bonding layer comprising an infrared and visible light transparent layer less than 0.5 µm thick.

18. The coating according to claim 17, wherein said bonding layer is one of Ge, Si, $Ge_xC_{1-x}$, $Si_xC_{1-x}$ where $0<x<1$.

19. The coating according to claim 16, wherein said coating is an anti-reflective coating for a wavelength $\lambda$ wherein said nitride layer has a refractive index $n_1$ and has a thickness d, where d equals $\lambda/4n_1$.

20. An infrared and visible light transparent coating for a non-metallic light transmissive substrate, said coating provided by the steps of:

providing an anode and a cathode inside a vacuum chamber;

arranging a target of at least one of Zr, Y, Ce, Th and Eu on said cathode;

mounting said non-metallic light transmissive substrate to be coated opposite and spaced from said cathode;

maintaining said non-metallic light transmissive substrate at a desired temperature of between 500° and 600° C.;

flowing gases of argon and nitrogen through said vacuum chamber while maintaining a reduced pressure inside said chamber; and providing a glow discharge plasma inside said chamber between said anode and said cathode, whereby argon ions sputter off material from said target to combine with nitrogen on said substrate forming said desired coating transparent to visible and infrared radiation.

* * * * *